(12) United States Patent
Ball et al.

(10) Patent No.: US 11,852,370 B2
(45) Date of Patent: Dec. 26, 2023

(54) METHODS, DEVICES, AND SYSTEMS FOR PROVIDING MAINTENANCE ON ENVIRONMENTAL CONTROL SYSTEMS

(71) Applicant: PCX Holding LLC, Clayton, NC (US)

(72) Inventors: Jason J. Ball, Clayton, NC (US); Jonathan J. Horvath, Knightdale, NC (US); Gary Pollock, Sims, NC (US)

(73) Assignee: PCX Holding LLC, Clayton, NC (US)

( * ) Notice: Subject to any disclaimer, the term of this patent is extended or adjusted under 35 U.S.C. 154(b) by 227 days.

(21) Appl. No.: 17/018,392

(22) Filed: Sep. 11, 2020

(65) Prior Publication Data

US 2022/0082293 A1    Mar. 17, 2022

(51) Int. Cl.
| | |
|---|---|
| H05K 7/20 | (2006.01) |
| F24F 13/20 | (2006.01) |
| F24F 11/89 | (2018.01) |
| F24F 11/30 | (2018.01) |
| H05K 7/14 | (2006.01) |
| H05K 7/16 | (2006.01) |
| F24F 13/18 | (2006.01) |
| F24F 1/027 | (2019.01) |

(52) U.S. Cl.
CPC .............. *F24F 13/20* (2013.01); *F24F 11/30* (2018.01); *F24F 11/89* (2018.01); *H05K 7/1497* (2013.01); *H05K 7/16* (2013.01); *H05K 7/20* (2013.01); *H05K 7/20709* (2013.01); *F24F 1/027* (2013.01); *F24F 13/18* (2013.01); *F24F 2221/12* (2013.01)

(58) Field of Classification Search
CPC ........ F24F 1/027; F24F 13/18; F24F 2221/12; H05K 7/1497; H05K 7/16; H05K 17/20709
See application file for complete search history.

(56) References Cited

U.S. PATENT DOCUMENTS

| | | | | |
|---|---|---|---|---|
| 6,142,595 | A * | 11/2000 | Dellapi | H05K 7/1454 312/326 |
| 8,537,536 | B1 * | 9/2013 | Rembach | H05K 7/1497 361/679.48 |
| 2004/0100770 | A1 * | 5/2004 | Chu | H05K 7/20754 361/698 |
| 2009/0310309 | A1 * | 12/2009 | Nelson | H05K 7/20518 361/702 |
| 2013/0104383 | A1 * | 5/2013 | Campbell | H05K 7/20263 29/592.1 |
| 2013/0306269 | A1 * | 11/2013 | Helbig | F28F 9/007 29/890.03 |
| 2014/0316583 | A1 * | 10/2014 | Ambriz | F24F 11/30 700/277 |

* cited by examiner

*Primary Examiner* — Jerry-Daryl Fletcher
*Assistant Examiner* — Daniel C Comings
(74) *Attorney, Agent, or Firm* — Ruggiero McAllister & McMahon LLC

(57) ABSTRACT

Disclosed herein are methods, systems, and devices for allowing access for maintenance and servicing of environmental control systems of prefabricated equipment enclosures. In one embodiment, an enclosure includes a first wall, a first environmental control unit, and a first door. The first door is mechanically coupled with the first environmental control unit and the first wall. The first door is configured to have a first closed position allowing in-service operation of the first environmental control unit for an internal space of the enclosure.

9 Claims, 6 Drawing Sheets

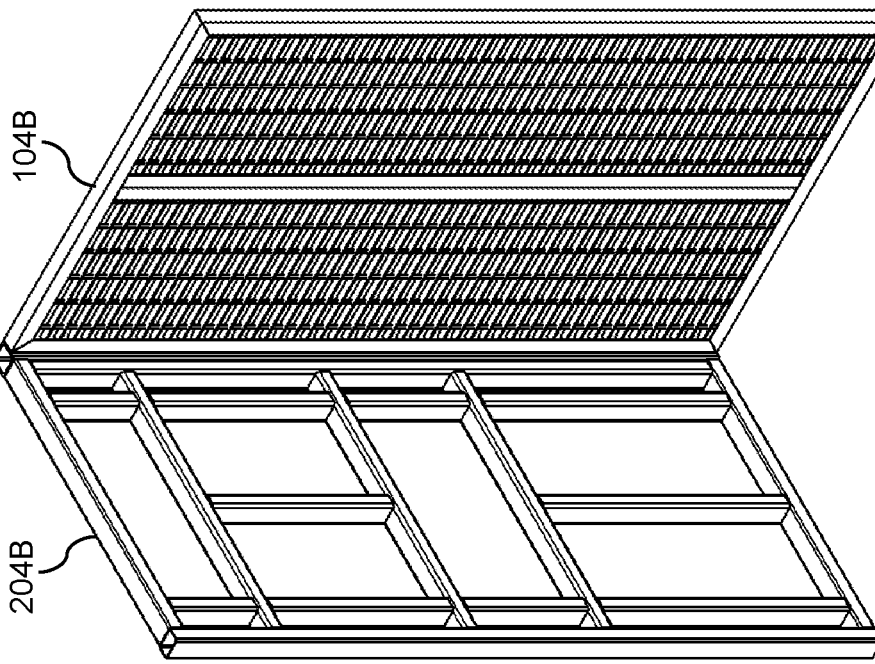
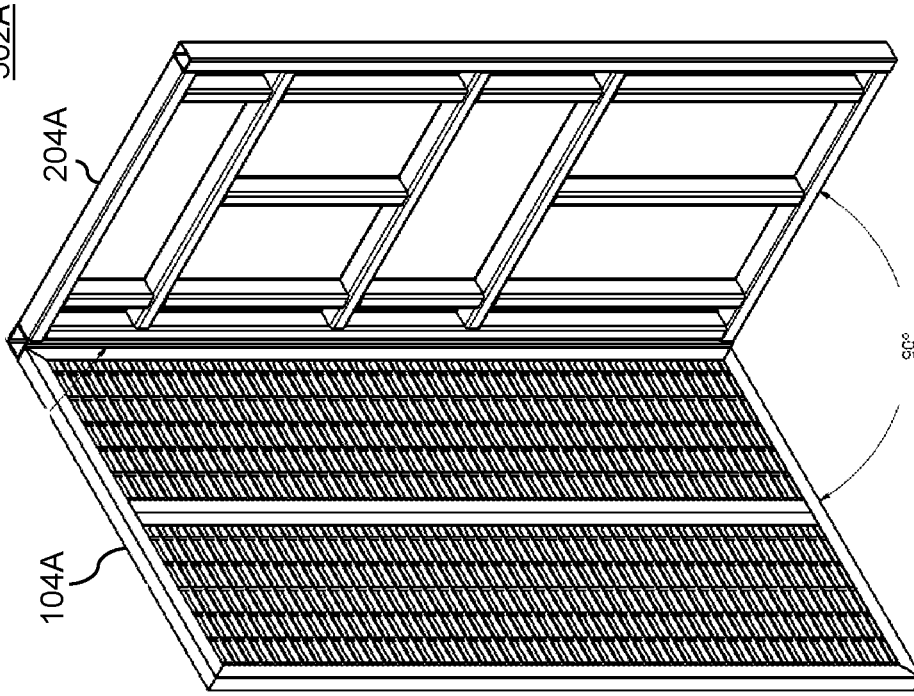

METHODS, DEVICES, AND SYSTEMS FOR PROVIDING MAINTENANCE ON ENVIRONMENTAL CONTROL SYSTEMS

TECHNICAL FIELD

The present invention relates generally to prefabricated equipment enclosures requiring environment control. More specifically the present invention relates to maintenance and servicing of environmental control systems for prefabricated equipment enclosures.

BACKGROUND

Prefabricated equipment enclosures housing various electrically powered systems can be manufactured at a factory with various pieces of electrical equipment installed. For example a prefabricated equipment enclosure may be a configured to house part or all of systems such as an electrical distribution center (EDC), a modular data center (MDC), an integrated power skid, an integrated switchboard, a switchboard section or cubicle or the like. Many of these systems require environmental control for removing heat buildup. Additionally, these systems can be used to maintaining temperature, humidity, and/or pressure within specifications of the enclosure housed equipment. Environmental control systems can include heating, cooling, ventilation and air conditioning (HVAC) units, and/or other types of heat exchangers. Additionally, industry continues to trend toward smaller more compact enclosures and/or additional equipment housed in existing enclosures. With this trend servicing and maintenance of the environmental control systems become more difficult.

Accordingly, a need exists for improved systems, devices, and methods for allowing access for maintenance and servicing of the environmental control systems of prefabricated equipment enclosures.

SUMMARY

This Summary is provided to introduce a selection of concepts in a simplified form that are further described below in the Detailed Description of Illustrative Embodiments. This Summary is not intended to identify key features or essential features of the claimed subject matter, nor is it intended to be used to limit the scope of the claimed subject matter.

Disclosed herein are methods, systems, and devices for allowing access for maintenance and servicing of environmental control systems of prefabricated equipment enclosures. In one embodiment, an enclosure includes a first wall, a first environmental control unit, and a first door. The first door is mechanically coupled with the first environmental control unit and the first wall. The first door is configured to have a first closed position allowing in-service operation of the first environmental control unit for an internal space of the enclosure.

In some embodiments, the first door may be mechanically coupled with the first wall using a first hinge. The first environmental control unit may be positioned within a first door mounting arrangement and the first environmental control unit may be configured for accessing air on each side of the first door. The first door may be further configured to have a first open position to facilitate maintenance of the first environmental control unit.

In some embodiments, the enclosure may also include a second door mechanically coupled with the first door. The second door may be configured to prevent human access to the first environmental control unit when the first door is in the first closed position. The second door may be configured to remain in a substantially stationary position relative to the first door when the first door is transitioned from the first closed position to the first open position.

In some embodiments, the first door may be substantially planar and the second door may be substantially planar. An angle of a first door normal vector and a second door normal vector may be between 70 degrees and 110 degrees. In other embodiments the angle of the first door normal vector and the second door normal vector may be between 80 degrees and 100 degrees. In still other embodiments the angle of the first door normal vector and the second door normal vector may be substantially 90 degrees.

In some embodiments, the enclosure may include a second wall and a third door. The third door may be mechanically coupled with the second wall using a second hinge. The third door when in a second closed position may be configured to provide outside air to the first environmental control unit. The third door may be substantially planar and may be configured to be approximately parallel with the first door when the first door is in the first closed position and the third door is in the second closed position.

In some embodiments, the enclosure may also include a third wall, a second environmental control unit, and a fourth door. The fourth door may be mechanically coupled with the second environmental control unit and the third wall. The fourth door may be configured to have a third closed position allowing in-service operation of the second environmental control unit for the internal space of the enclosure.

In some embodiments, the fourth door may be mechanically coupled with the third wall using a third hinge. The second environmental control unit may be positioned within a second door mounting arrangement and the second environmental control unit may be configured for accessing air on each side of the fourth door. The fourth door may be further configured to have a third open position to facilitate maintenance of the second environmental control unit. The enclosure may also include a fifth door mechanically coupled with the fourth door. The fifth door may be configured to prevent human access to the second environmental control unit when the fourth door is in the third closed position.

In some embodiments, the fourth door may be substantially planar and the fifth door may be substantially planar. An angle of a fourth door normal vector and a fifth door normal vector may be between 70 degrees and 110 degrees. In other embodiments the angle of the fourth door normal vector and the fifth door normal vector may be between 80 degrees and 100 degrees. In still other embodiments the angle of the fourth door normal vector and the fifth door normal vector may be substantially 90 degrees.

In some embodiments, the first environmental control unit may be a heating unit; an air conditioning unit; a heating, ventilation, and air conditioning (HVAC) unit, or the like. In certain embodiments, the HVAC unit may have a three ton capacity. In other embodiments, the HVAC unit may have a five ton capacity.

In some embodiments, the second environmental control unit may be a heating unit; an air conditioning unit; a heating, ventilation, an HVAC unit, or the like. In certain embodiments, the HVAC unit may have a three ton capacity. In other embodiments, the HVAC unit may have a five ton capacity.

In some embodiments, the enclosure may be configured to be embedded within at least one of a prefabricated electrical distribution center (EDC), a modular data center (MDC), an integrated power skid, an integrated switchboard, a switchboard section, or a switchboard cubicle. The enclosure may be configured to be positioned within a skid mounted system configured to be positioned on a semi-trailer for shipping.

In some embodiments, the first environmental control unit may be configured to regulate at least one of temperature, humidity, filtration, and pressurization for the internal space of the enclosure. The second environmental control unit may also be configured to regulate at least one of temperature, humidity, filtration, and pressurization for the internal space of the enclosure.

In another embodiment, a method of servicing a first environmental control unit installed within an enclosure is disclosed. The method includes transitioning a first door from a closed position to an open position, performing a maintenance activity on the first environmental control unit; and transitioning the first door from an open position to a closed position. The first door is mechanically coupled with the first environmental control unit and a first wall of the enclosure and the closed position allows in-service operation of the first environmental control unit for an internal space of the enclosure.

In this embodiment, the first environmental control unit may also be configured to regulate at least one of temperature, humidity, filtration, and pressurization for the internal space of the enclosure.

In this embodiment, the enclosure may be configured to be embedded within at least one of a prefabricated electrical distribution center (EDC), a modular data center (MDC), an integrated power skid, an integrated switchboard, a switchboard section, or a switchboard cubicle. The enclosure may be configured to be positioned within a skid mounted system configured to be positioned on a semi-trailer for shipping.

In another embodiment, a door is disclosed for allowing maintenance and servicing of environmental control systems of prefabricated equipment enclosures. The door includes a first mounting arrangement configured for positioning a first environmental control unit such that the first environmental control unit is configured for accessing air on each side of the door. The door also includes a second mounting arrangement configured for allowing mechanical coupling using a hinge to a first wall of an enclosure. Upon installation, the door is configured to have a closed position allowing in-service operation of the first environmental control unit for an internal space of the enclosure, and an open position allowing maintenance of the first environmental control unit.

In this embodiment, the first environmental control unit may also be configured to regulate at least one of temperature, humidity, filtration, and pressurization for the internal space of the enclosure.

In this embodiment, the enclosure may be configured to be embedded within at least one of a prefabricated electrical distribution center (EDC), a modular data center (MDC), an integrated power skid, an integrated switchboard, a switchboard section, or a switchboard cubicle. The enclosure may be configured to be positioned within a skid mounted system configured to be positioned on a semi-trailer for shipping.

In another embodiment, a method of manufacturing a prefabricated equipment enclosure using a shipping container is disclosed. The method includes removing a first portion of the shipping container and installing a first multi-door arrangement using at least one hinge onto a first wall of the shipping container. The first multi-door arrangement includes a first door and a second door. The method further includes installing a first environmental control unit onto the first door. The first environmental control unit is configured for accessing air on each side of the first door. The first multi-door arrangement is configured to have a first closed position allowing in-service operation of the first environmental control unit for an internal space of the enclosure. The first multi-door arrangement is further configured to have a first open position to facilitate maintenance of the first environmental control unit.

In this embodiment, the first door may be substantially planar and the second door may be substantially planar. An angle of a first door normal vector and a second door normal vector may be between 70 degrees and 110 degrees. In other embodiments the angle of the first door normal vector and the second door normal vector may be between 80 degrees and 100 degrees. In still other embodiments the angle of the first door normal vector and the second door normal vector may be substantially 90 degrees.

In this embodiment, the method may further include removing a second portion of the shipping container and installing a second multi-door arrangement using at least one hinge onto a second wall of the shipping container. The second multi-door arrangement may include a third door and a fourth door. The method may further include installing a second environmental control unit onto the third door. The second environmental control unit may be configured for accessing air on each side of the third door. The second multi-door arrangement may be configured to have a second closed position allowing in-service operation of the second environmental control unit for the internal space of the prefabricated equipment enclosure. The second multi-door arrangement may be further configured to have a second open position to facilitate maintenance of the second environmental control unit.

In this embodiment, the third door may be substantially planar and the fourth door may be substantially planar. An angle of a third door normal vector and a fourth door normal vector may be between 70 degrees and 110 degrees. In other embodiments the angle of the third door normal vector and the fourth door normal vector may be between 80 degrees and 100 degrees. In still other embodiments the angle of the third door normal vector and the fourth door normal vector may be substantially 90 degrees.

In this embodiment, the shipping container may be an International Organization for Standardization (ISO) shipping container In another embodiment, an enclosure includes a first wall, a first field serviceable device, and a first door. The first door is mechanically coupled with the first field serviceable device and the first wall. The first door is configured to have a first closed position allowing in-service operation of the first field serviceable device for an internal space of the enclosure. In some embodiments, the first field serviceable device may include a thermoelectric cooling system.

In another embodiment, a method of manufacturing a prefabricated equipment enclosure using a shipping container is disclosed. The method includes removing a first portion of the shipping container and installing a first multi-door arrangement using at least one hinge onto a first wall of the shipping container. The first multi-door arrangement includes a first door and a second door. The method further includes installing a first field serviceable device onto the first door. The first multi-door arrangement is configured to have a first closed position allowing in-service operation of the first field serviceable device for an internal space of the enclosure. The first multi-door arrangement is further configured to have a first open position to facilitate maintenance of the first field serviceable device. In some embodiments, the first field serviceable device may include a thermoelectric cooling system. In certain embodiments, the first field serviceable device may be configured for accessing air on each side of the first door.

BRIEF DESCRIPTION OF THE DRAWINGS

The present embodiments are illustrated by way of example and are not intended to be limited by the figures of the accompanying drawings. In the drawings:

FIG. 5A depicts a mechanical diagram illustrating a left multi-door arrangement for the prefabricated equipment enclosure in accordance with embodiments of the present disclosure.

FIG. 5B depicts a mechanical diagram illustrating a right multi-door arrangement for the prefabricated equipment enclosure in accordance with embodiments of the present disclosure.

DETAILED DESCRIPTION

The presently disclosed subject matter is described with specificity to meet statutory requirements. However, the description itself is not intended to limit the scope of this patent. Rather, the inventors have contemplated that the claimed invention might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described.

The current industry trend is towards more prefabricated systems (including enclosures) where space□efficiency and smaller footprints are key traits for success in the market. Disclosed herein are improved methods, systems, and devices for allowing access for maintenance and servicing of environmental control systems of prefabricated equipment enclosures. Environmental control systems may include heating, cooling, ventilation and air conditioning (HVAC) units, and/or other types of heat exchangers.

Figure 1:
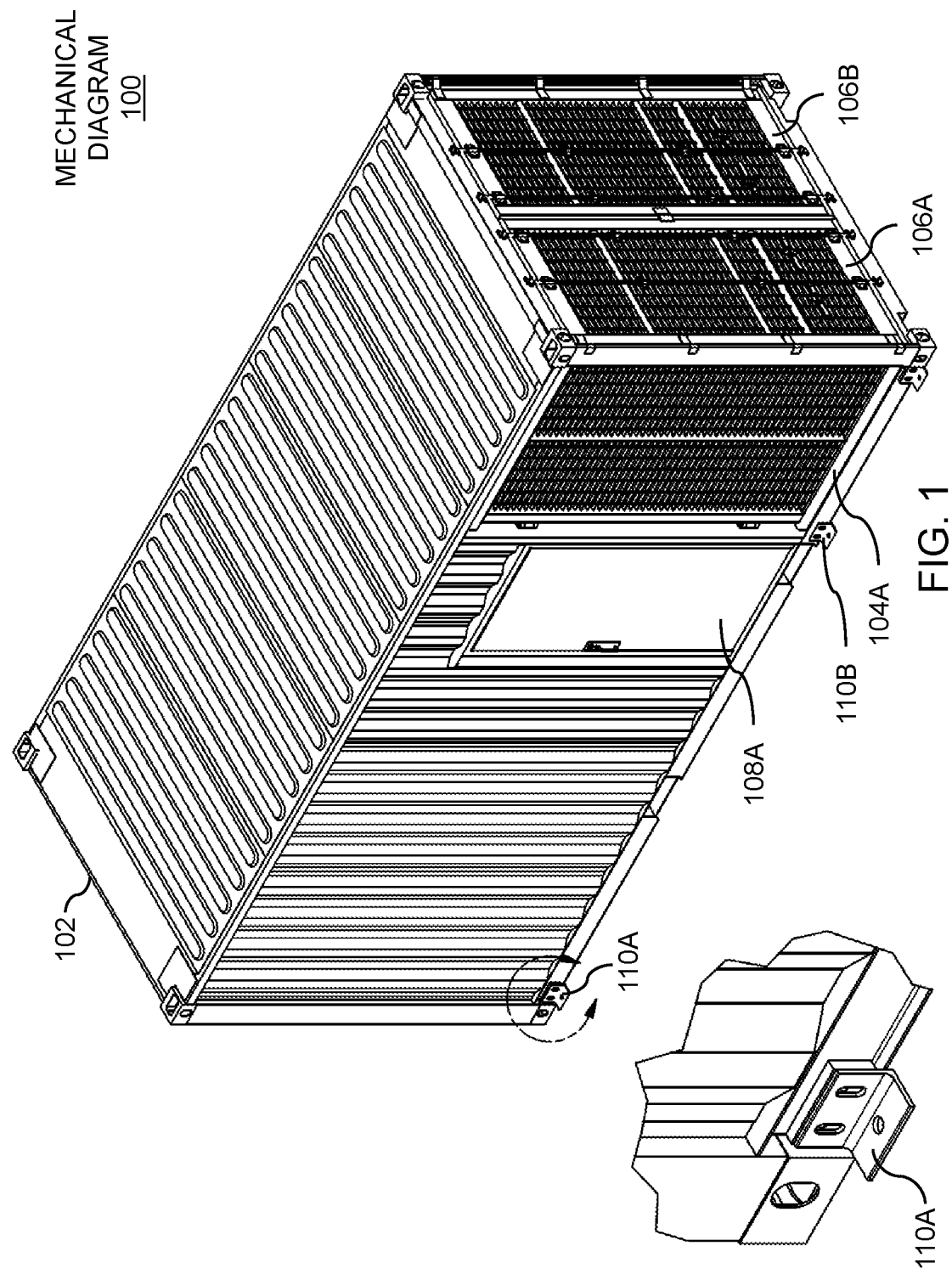
FIG. 1 depicts a mechanical diagram illustrating a three-dimensional view of a prefabricated equipment enclosure in accordance with embodiments of the present disclosure.

FIG. 1 depicts a mechanical diagram 100 illustrating a first three-dimensional view of a prefabricated equipment enclosure 102 in accordance with embodiments of the present disclosure. The prefabricated equipment enclosure 102 as depicted is configured for in-service operation of two HVAC units (not shown in FIG. 1) embedded within the dimensions of the prefabricated equipment enclosure 102. Each HVAC unit may have a five ton capacity. In other embodiments, each HAVC unit may have a three ton capacity. In some embodiments each HVAC unit may have up to a six ton capacity. In still other embodiments, the HVAC unit may have less than a three ton capacity or greater than a six ton capacity. In still other embodiments, additional types of environmental control systems may be used. For example the environmental control system may include at least one thermoelectric cooling system.

The prefabricated equipment enclosure 102 may be constructed by modifying a 20 foot high□cube International Organization for Standardization (ISO) shipping container having an outside height of approximately 2.60 meters, and outside width of approximately 2.44 meters, and an outside length of approximately 6.06 meters.

In other embodiments, the prefabricated equipment enclosure 102 may be constructed from a 40 foot high□cube ISO shipping container having an outside height of approximately 2.60 meters, and outside width of approximately 2.44 meters, and an outside length of approximately 12.20 meters. In still other embodiments, the prefabricated equipment enclosure 102 may be constructed from a 10 foot high□cube ISO shipping container having an outside height of approximately 2.60 meters, and outside width of approximately 2.44 meters, and an outside length of approximately 3.00 meters. In still other embodiments, other types of enclosures may be modified to produce the prefabricated equipment enclosure 102. In still other embodiments, the prefabricated equipment enclosure 102 may be stick□built structure (e.g. first assembled using individual components). Additionally, enclosures may be built on site configured for like functionality to the prefabricated equipment enclosure 102.

The prefabricated equipment enclosure 102 includes a left HVAC swingout access door 104A, a left HVAC front access door 106A, and a right HVAC front access door 106B. A right HVAC swingout access door 104B is hidden from view in FIG. 1. Access doors 104A-B and 106A-B including grating to allow free air flow to external air sides of the HVAC units. The grating also provides security from unauthorized access to the HVAC units. The prefabricated equipment enclosure 102 includes a left side access door 108A configured to allow personnel to install and maintain equipment housed within. The equipment may include data center equipment such as servers and uninterruptible power supplies (UPSs), data patch panels, or the like.

The prefabricated equipment enclosure 102 may be configured to be embedded within a larger electrical distribution center (EDC), a modular data center (MDC), an integrated power skid, an integrated switchboard, a switchboard section, a switchboard cubicle, or the like. The prefabricated equipment enclosure 102 may also be configured to be positioned within a skid mounted system configured to be positioned on one or more semi-trailers for shipping. Mounting brackets, such as bracket 110A and bracket 110B, may be used to secure the prefabricated equipment enclosure 102 to the skid mounted system or in the final facility of installation.

Figure 2:
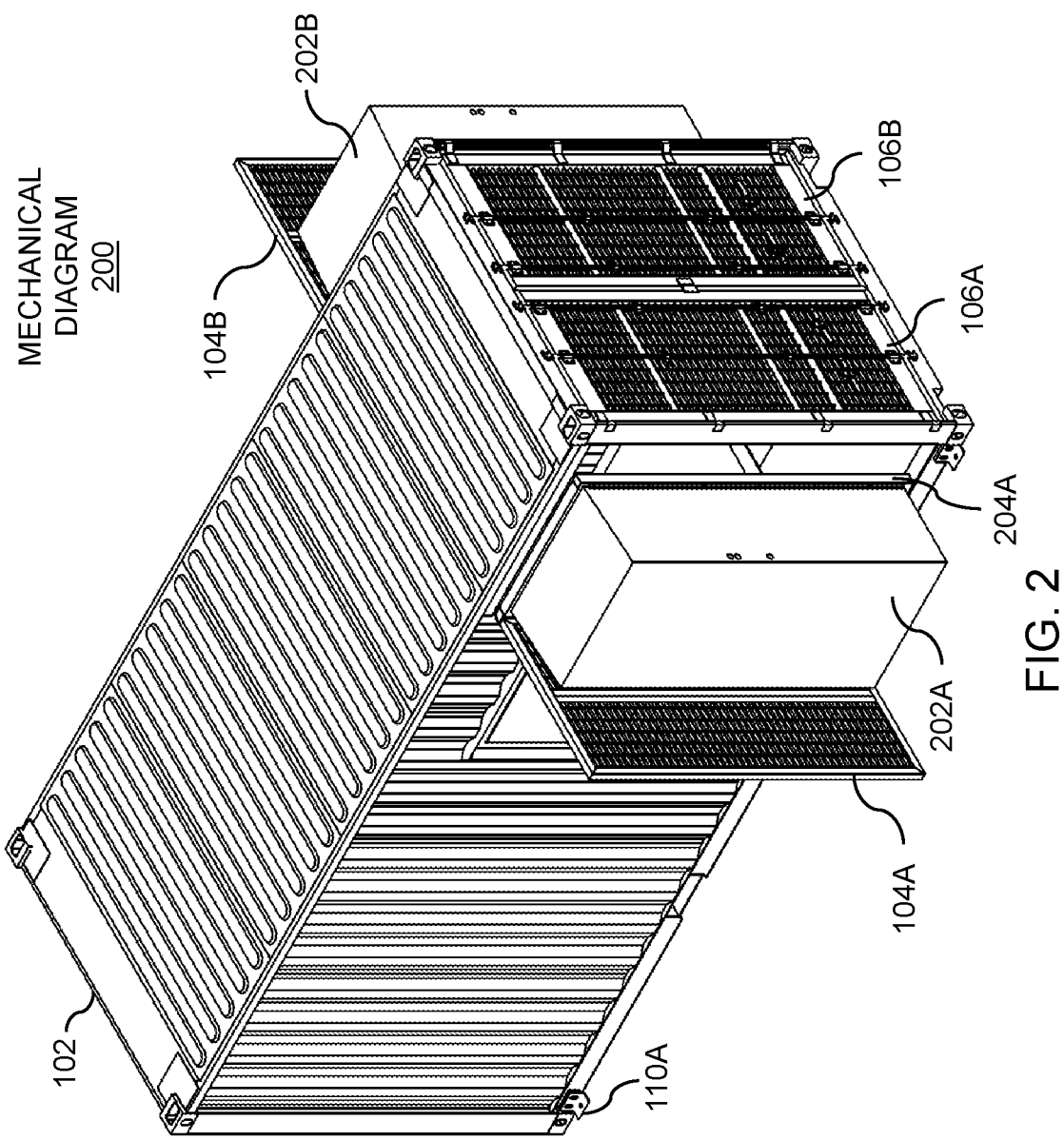
FIG. 2 depicts another mechanical diagram illustrating another three-dimensional view of the prefabricated equipment enclosure in accordance with embodiments of the present disclosure.

FIG. 2 depicts a mechanical diagram 200 illustrating a second three-dimensional view the prefabricated equipment enclosure 102 in accordance with embodiments of the present disclosure. The prefabricated equipment enclosure 102 is depicted with the left HVAC swingout access door 104A open exposing a left HVAC unit 202A, and the right HVAC swingout access door 104B open exposing a right HVAC unit 202B. As such, the external air sides of the left HVAC unit 202A and the right HVAC unit 202B may be easily accessed from outside the prefabricated equipment enclosure 102. Additionally, the left HVAC front access door 106A and the right HVAC front access door 106B may each be opened to expose the internal air sides of the left HVAC unit 202A and the right HVAC unit 202B respectively.

The left HVAC unit 202A is mounted using a frame arrangement to an internal door 204A. The left internal door 204A is configured to be substantially stationary with respect to the left HVAC swingout access door 104A. An angle of a normal vector associated with the left HVAC swingout access door 104A is approximately 90 degrees to a normal vector associated with the left internal door 204A. The right HVAC unit 202B is mounted also using a frame arrangement to a right internal door 204B. The right internal door 204B is configured to be substantially stationary with respect to the right HVAC swingout access door 104B. An angle of a normal vector associated with the right HVAC swingout access door 104B is approximately 90 degrees to a normal vector associated with the right internal door 204A.

The HVAC unit 202A is wired with controls and power umbilical cables near a pivoting edge (e.g. one or more hinges) of the left HVAC swingout access door 104A and left internal door 204A (i.e. swinging frame). Power cables coming from a main distribution panel inside the prefabricated equipment enclosure 102 pass through an internal partition wall (not shown in FIG. 2). The power cables then loop down and back up to pass through the swinging frame and into the back of the HVAC unit 202A. There is enough extra length in each loop to allow for the full range of motion of the swinging frame. Controls wiring is routed in a similar manner. The power cables and the controls wiring are also not shown in FIG. 2. Power cables and controls wiring for the right HVAC unit 202B are routed in a similar manner.

When the left HVAC swingout access door 104A and the left internal door 204A (i.e. the swinging frame) are in the closed position (as shown in FIG. 1), the left internal door 204A sits parallel to the internal partition wall. The internal partition wall forms a boundary between internal air and external air to the prefabricated equipment enclosure 102 that separates the inside from the outside. Double seals between the internal partition wall and the left internal door 204A provide additional insulation between the internal air and the external air allowing the HVAC unit 202A to work more efficiently. One set of weather seal is around the air supply and return openings. The other seal follows the outer edge of the left internal door 204A each swinging frame. Additionally, the HVAC unit 202A has seals insulating it with the left internal door 204A. The right HVAC unit 202B has a similar weather seal arrangement.

Figure 3:
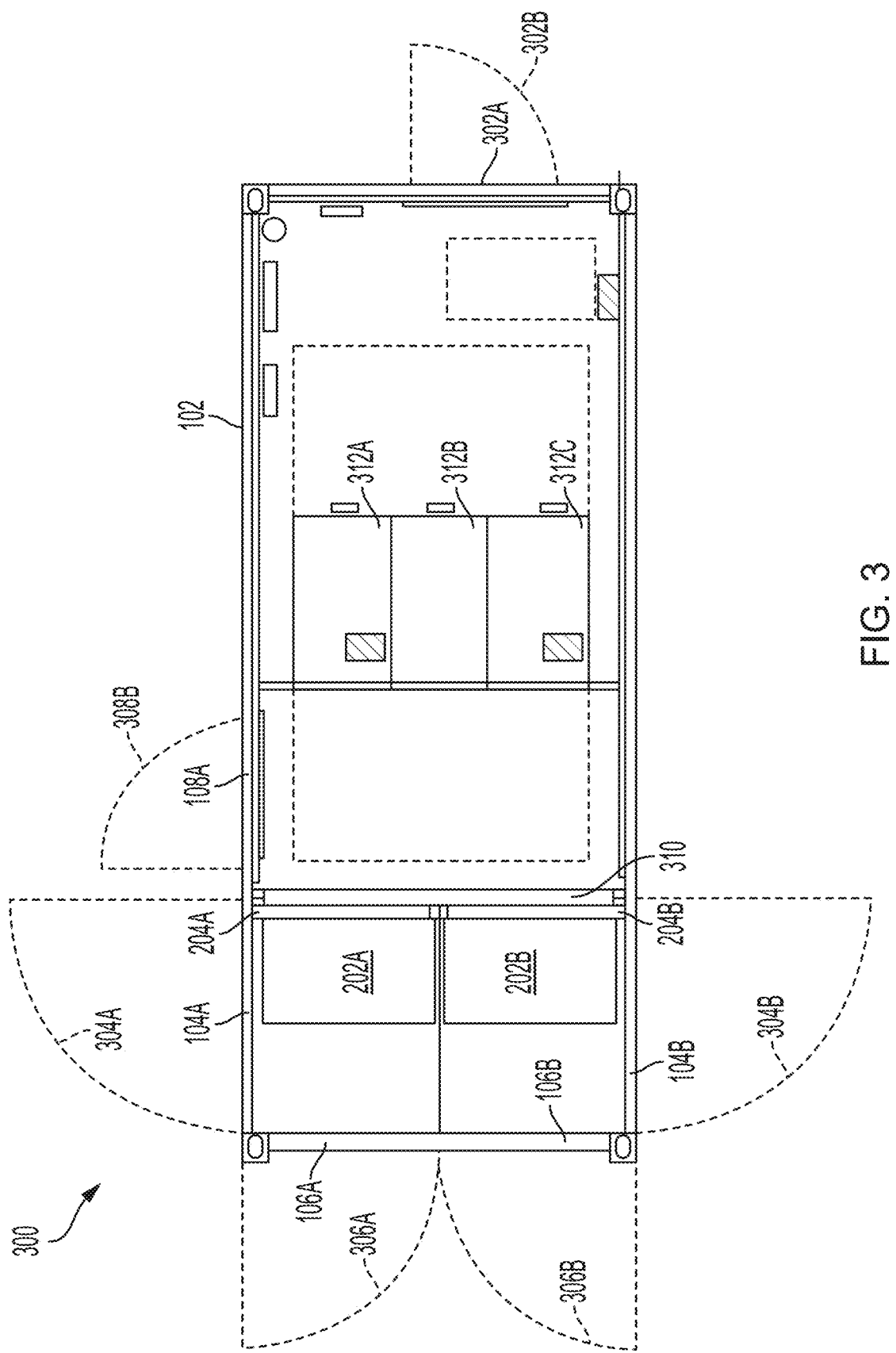
FIG. 3 depicts a mechanical diagram illustrating a top view of the prefabricated equipment enclosure in accordance with embodiments of the present disclosure.

FIG. 3 depicts a mechanical diagram 300 illustrating a top view of the prefabricated equipment enclosure 102 in accordance with embodiments of the present disclosure. A door swing radius 304A is depicted for the left HVAC swingout access door 104A and a door swing radius 304B is depicted for the right HVAC swingout access door 104B. The door swing radiuses 304A and 304B are each approximately 90 degrees. A door swing radius 306A is depicted for the left HVAC front access door 106A and a door swing radius 306B is depicted for the right HVAC front access door 106B. The door swing radiuses 306A and 306B are also each approximately 90 degrees.

A door swing radius 308A is depicted for the left side access door 108A. The prefabricated equipment enclosure 102 also includes a rear access door 302A having a door swing radius 302B. The door swing radiuses 308A and 302B are also each approximately 90 degrees.

The internal partition wall 310 (previously disclosed in the FIG. 2 description) separates the prefabricated equipment enclosure 102 into an HVAC section and a datacenter section. The HVAC units 202A and 202B are housed in the HVAC section while the internal doors 204A and 204B are in the closed position as depicted in FIG. 1 and FIG. 3. The datacenter section houses server racks 312A, 312B, and 312C.

When there is a need to service an HVAC unit 202A or 202B from their inward facing side (which may be only a few inches from the neighboring HVAC unit) the given unit mat be swung out to expose that area. Both HVAC units 202A and 202B may be swung to the "open" service position independently of each other.

Figure 4B:
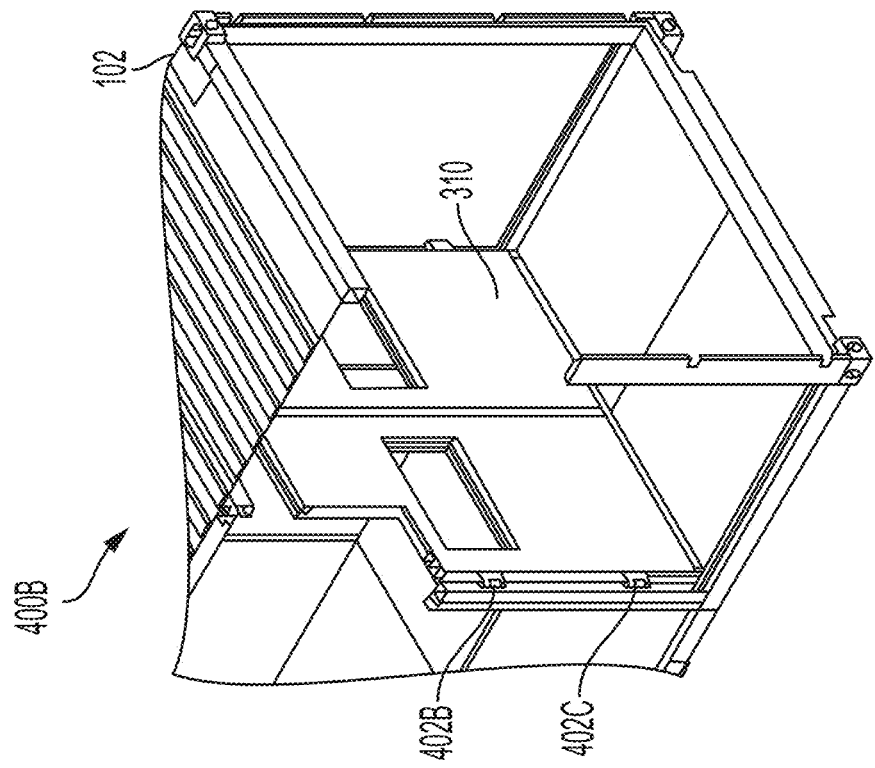
FIG. 4B depicts another mechanical diagram illustrating a three-dimensional cutaway view of a portion of the prefabricated equipment enclosure in accordance with embodiments of the present disclosure.
Figure 4A:
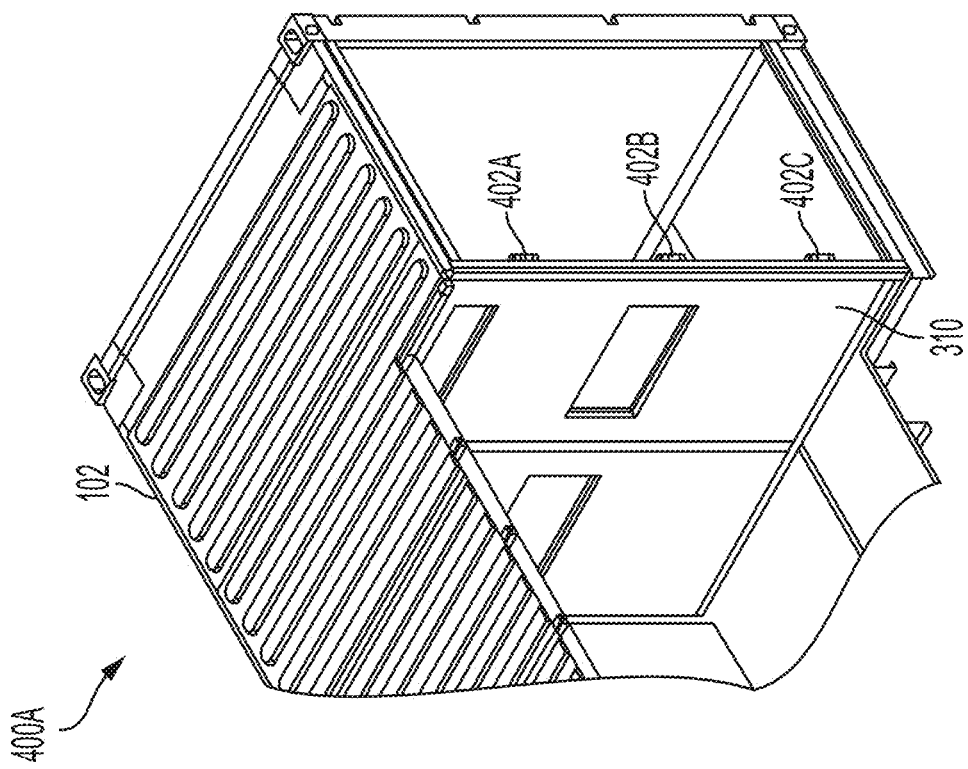
FIG. 4A depicts a mechanical diagram illustrating a three-dimensional cutaway view of a portion of the prefabricated equipment enclosure in accordance with embodiments of the present disclosure.

FIGS. 4A and 4B depict mechanical diagrams 400A and 400B illustrating three-dimensional cutaway views of a portion of the prefabricated equipment enclosure 102 in accordance with embodiments of the present disclosure. The internal partition wall 310 is also depicted without the HVAC units 202A and 202B, the HVAC swingout access doors 104A and 104B, and the internal doors 204A and 204B. Partial hinges 402A-402C are depicted for securing the left internal door 204A and the left HVAC swingout access door 104A to the prefabricated equipment enclosure 102.

FIG. 5A depicts a mechanical diagram 500A illustrating a left multi-door arrangement 502A for the prefabricated equipment enclosure 102 in accordance with embodiments of the present disclosure. The left multi-door arrangement 502A includes the left HVAC swingout access door 104A and the left internal door 204A The left internal door 204A is configured to be substantially stationary with respect to the left HVAC swingout access door 104A. The left internal door 204A is further configured for mounting the left HVAC unit 202A. An angle of a normal vector associated with the left HVAC swingout access door 104A is approximately 90 degrees to a normal vector associated with the left internal door 204A. In some embodiments, the angle of the normal vector may be less than 90 degrees. For example, the angle of the normal vector may be between 70 degrees and 90 degrees. In other embodiments, the angle of the normal vector may be greater than 90 degrees. For example, the angle of the normal vector may be between 90 degrees and 110 degrees.

FIG. 5B depicts a mechanical diagram 500B illustrating a right multi-door arrangement 502B for the prefabricated equipment enclosure 102 in accordance with embodiments of the present disclosure. The right multi-door arrangement 502B includes the right HVAC swingout access door 104B and the right internal door 204B. The right internal door 204B is configured to be substantially stationary with respect to the right HVAC swingout access door 104B. The right internal door 204B is further configured for mounting the right HVAC unit 202B. An angle of a normal vector associated with the right HVAC swingout access door 104B is approximately 90 degrees to a normal vector associated with the right internal door 204B. In some embodiments, the angle of the normal vector may be less than 90 degrees. For example, the angle of the normal vector may be between 70 degrees and 90 degrees. In other embodiments, the angle of the normal vector may be greater than 90 degrees. For example, the angle of the normal vector may be between 90 degrees and 110 degrees.

The multi-door arrangements 502A and 502B form swing out frames when secured to the prefabricated equipment enclosure 102. While in the closed position, the HVAC units 202A and 202B and their supporting structures are fully contained within the prefabricated equipment enclosure 102. The front areas of the HVAC units 202A and 202B are unobstructed and fully operational with the multi-door arrangement 502A and 502B in the closed position. When there is a need to service either HVAC unit 202A or 202B from its outward facing side, the grating covering the given HVAC unit's side panels may be removed.

The multi-door arrangements 502A and 502B comprise hollow structural section (HSS) rectangular steel tubes that support the HVAC units 202A and 202B and frame out supply air vents and return air vents. The multi-door arrangements 502A and 502B are supported by heavy-duty hinges and pivot off a steel column that is integrated into the structure of the prefabricated equipment enclosure 102. Side walls of the prefabricated equipment enclosure 102 are cut back to allow the HVAC units 202A and 202B to swing out from the internal partition wall 310. This HVAC section is open on three sides for outside airflow and so grating is installed to block unapproved access to the units. The grating at the sides are fully framed and bolted on to allow removal of the HVAC units 202A and 202B for servicing. This side grating is held by a steel angle frame that is welded to the multi-door arrangements 502A and 502B. Consequently, the each side grating moves with the multi-door arrangements 502A and 502B as they swing out.

The multi-door arrangements 502A and 502B are configured to be opened and closed by hand and are secured in the closed position from inside the datacenter section. The datacenter section may require key-card access and/or other keyed access. This prevents exposing the server racks 312A, 312B, and 312C to theft through the lower return vents and also secures the internal doors 204A and 204B tightly against the internal partition wall 310. While in the closed position, exteriors of the HVAC units 202A and 202B are protected by gratings that would have to be unbolted in order to get inside the HVAC section.

Figure 6:
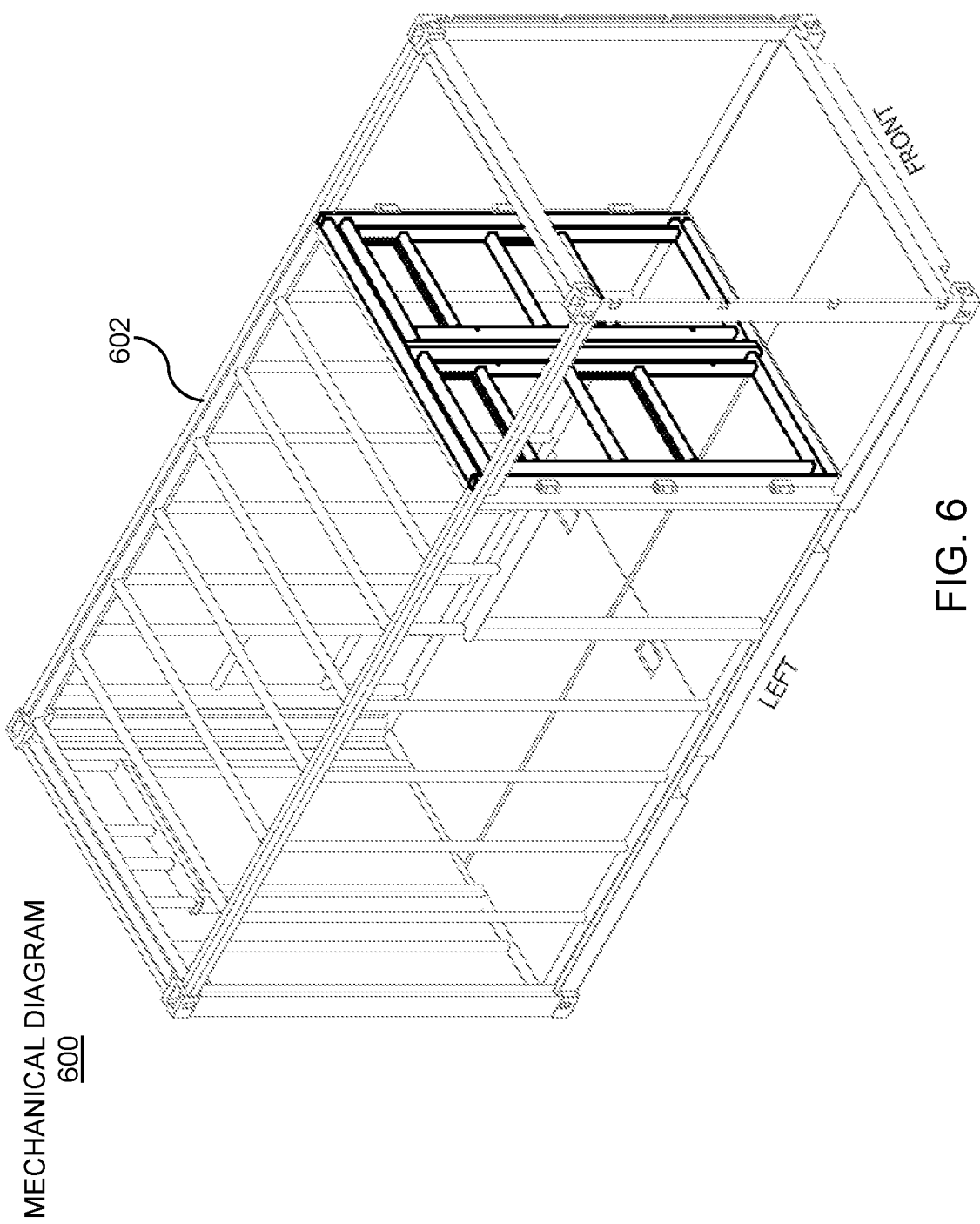
FIG. 6 depicts a mechanical diagram illustrating a frame arrangement for the prefabricated equipment enclosure in accordance with embodiments of the present disclosure.

FIG. 6 depicts a mechanical diagram 600 illustrating a frame arrangement 602 for the prefabricated equipment enclosure 102 in accordance with embodiments of the present disclosure. In some embodiments, instead of being modified the prefabricated equipment enclosure 102 may be full assembled using the frame arrangement 602 or the like (i.e. stick built).

The methods, systems, and devices disclosed herein for allowing access for maintenance and servicing of environmental control systems of prefabricated equipment enclosures may be applied anywhere there is a need to service equipment that has prohibited an otherwise more efficient use of space. This swing-out arrangement may be implemented with not only environmental control systems (e.g. HVAC units), but also switchgear, transformers, entire data racks, and anything else that would be structurally mounted and only requires simple electrical hook-up through an umbilical arrangement. In summary, these methods, systems, and devices may be leveraged to push the boundaries of space-efficiency in prefabricated data centers, power equipment centers, and many other modular electrical systems.

While the embodiments have been described in connection with the preferred embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A method of servicing a first environmental control unit installed within an enclosure; the method comprising:
   transitioning an outer door from a closed position to an open position;
   transitioning, once the outer door is in the open position, a first door from a use position to a service position;
   performing a maintenance activity on the first environmental control unit with at least a portion of the first environmental control unit exterior to an interior space of the enclosure when the outer door is in the open position and the first door is in the service position;
   transitioning the first door from the service position to the use position such that the first environmental control unit is in the interior space when the first door is in the use position, wherein:
   the first door is mechanically coupled with the first environmental control unit and a first wall of the enclosure; and
   transitioning the outer door from the open position to the closed position to enclose the first environmental control unit in the interior space.

2. The method of claim 1, wherein the first door is in a partition wall of the enclosure, the partition wall separating the interior space of the enclosure into an HVAC section and a datacenter section, and wherein, when the first door is in the use position, the first environmental control unit is operatively sealed in the partition wall to seal the HVAC and datacenter sections from one another.

3. The method of claim 2, wherein the outer door comprises grating that allows free air flow into the HVAC section from an exterior of the enclosure.

4. The method of claim 2, further comprising moving an access door between an access position and a non-access position, wherein the data center section is closed when the access door is in the non-access position and the data center section is open when the access door is in the access position.

5. The method of claim 2, wherein the first environmental control unit comprises an air supply sealed in an air supply opening of the partition wall and an air return sealed in a return opening of the partition wall.

6. The method of claim 2, wherein the first door comprises an inner surface having a seal that seals against the partition wall when the first door is in the use position.

7. The method of claim 1, wherein the first door is configured to remain in the use position until the outer door is moved to the open position.

8. The method of claim 1, wherein the first environmental control unit is selected from a group consisting of a heating unit, a cooling unit, a heating ventilation and air conditioning (HVAC) unit, and a heat exchanger.

9. The method of claim 1, wherein the enclosure is sized and configured to be positioned a semi-trailer for shipping.

* * * * *